(12) United States Patent
Vagos (10) Patent No.: US 7,410,815 B2
(45) Date of Patent: Aug. 12, 2008

(54) APPARATUS AND METHOD FOR NON-CONTACT ASSESSMENT OF A CONSTITUENT IN SEMICONDUCTOR SUBSTRATES

(75) Inventor: Pedro Vagos, Bend, OR (US)

(73) Assignee: Nanometrics Incorporated, Milpitas, CA (US)

( * ) Notice: Subject to any disclaimer, the term of this patent is extended or adjusted under 35 U.S.C. 154(b) by 170 days.

(21) Appl. No.: 11/212,971

(22) Filed: Aug. 25, 2005

(65) Prior Publication Data

US 2007/0048948 A1   Mar. 1, 2007

(51) Int. Cl.
*H01L 21/00* (2006.01)
*G01R 31/26* (2006.01)

(52) U.S. Cl. .............................. 438/7; 438/14; 438/16; 257/E21.53

(58) Field of Classification Search .................. 438/16; 216/60; 356/316; 257/E21.53
See application file for complete search history.

(56) References Cited

U.S. PATENT DOCUMENTS

| | | | |
|---|---|---|---|
| 3,906,231 A | 9/1975 | Fletcher et al. | |
| 4,555,767 A | 11/1985 | Case et al. | |
| 4,807,991 A * | 2/1989 | Carew | 356/72 |
| 5,403,433 A * | 4/1995 | Morrison et al. | 216/60 |
| 6,803,576 B2 | 10/2004 | Pretto et al. | |
| 6,943,884 B2 * | 9/2005 | Rice | 356/437 |
| 6,946,394 B2 * | 9/2005 | Fielden et al. | 438/680 |

FOREIGN PATENT DOCUMENTS

WO   WO-2007/024332 A2   3/2007
WO   WO-2007/024332 A3   3/2007

OTHER PUBLICATIONS

Born, Max, Emil Wolf, Principles of Optics, Cambridge University Press, 1959.
Ei6 Plasma Frequency, University of Melbourne School of Physics Lecture Demonstration Manual, http://www.ph.unimelb.edu.au/staffresources/lecdem/ei6.htm.
Fitzpatrick, Richard, "The plasma frequency," Lecture Notes, Introduction to Plasma Physics, University of Texas Austin, http://farside.ph.texas.edu/teaching/plasma/lectures/node6.html.

(Continued)

*Primary Examiner*—Michael S. Lebentritt
*Assistant Examiner*—Ron E Pompey
(74) *Attorney, Agent, or Firm*—Silicon Valley Patent Group LLP (57) ABSTRACT

Methods and apparatus for assessing a constituent in a semiconductor substrate. Several embodiments of the invention are directed toward non-contact methods and systems for identifying an atom specie of a dopant implanted into the semiconductor substrate using techniques that do not mechanically contact the substrate with electrical leads or other types of mechanical measuring instruments. For example, one embodiment of a non-contact method of assessing a constituent in a semiconductor substrate in accordance with the invention comprises obtaining an actual reflectance spectrum of infrared radiation reflected from the semiconductor substrate, and ascertaining a plasma frequency value ($\omega_p$) and a collision frequency value ($\gamma$) for the semiconductor substrate based on the actual reflectance spectrum. This method can further include identifying a dopant type based on a relationship between dopant types and (a) plasma frequency values and (b) collision frequency values.

21 Claims, 5 Drawing Sheets

OTHER PUBLICATIONS

Hagan, David J., "Fundamentals of Optical Science-OSE 5312 Fall 2003," University of Central Florida College of Optics and Phonotics, Sep. 3, 2003, http://nlo.optics.ucf.edu/hagan/OSE5312fall2003/.

Jones, R. Victor, "Drude Model of Electrical Conduction in Metals," Lecture Notes, Harvard University Engineering Sciences, http://people.deas.harvard.edu/~jones/es154/lectures/lecture_2/drude_model_cc.html.

Pernot et al., "From Transport Measurements to Infrared Reflectance Spectra of n-Type Doped 4H-SiC Layer Stacks," Materials Science Forum, vols. 433-436, 2003, Trans Tech Publications, http://www.scientific.net/Plasma_Frequency.htm.

International Search Report mailed on Sep. 13, 2007 for PCT Application No. PCT/US2006/025174 filed on Jun. 27, 2006 by Accent Optical Technologies, Inc., 2 pages.

* cited by examiner

APPARATUS AND METHOD FOR NON-CONTACT ASSESSMENT OF A CONSTITUENT IN SEMICONDUCTOR SUBSTRATES

TECHNICAL FIELD

The present invention generally relates to non-contact methods and apparatus for assessing constituents in semiconductor substrates. For example, several embodiments of the invention are related to non-contact methods and apparatus for determining the particular atom specie of a dopant implanted into a semiconductor substrate.

BACKGROUND

Microelectronic devices are manufactured on silicon wafers, gallium arsenide wafers, and other types of semiconductor substrates. The semiconductor substrates generally have an epitaxial layer with discrete regions were specific types of atoms have been incorporated to impart the desired conductivity to the discrete regions. A typical ion implantation procedure involves constructing a pattern across the surface of the substrate using photolithography processes, and then implanting exact concentrations of the atoms into the epitaxial layer. The workpieces are then stored in cassettes that hold a plurality of similar substrates for further processing in tools at different locations throughout a facility.

One problem with manufacturing microelectronic devices is that some cassettes may be mislabeled or the workpieces may be loaded into the wrong cassette. For example, because semiconductor device manufacturers typically process many different types of products with different dopants at the same facility, substrates can be inadvertently loaded into the wrong cassettes or otherwise misplaced. As a result, such substrates will be processed incorrectly in subsequent procedures and likely ruined after having been processed through very expensive photolithographic and ion implantation procedures.

To reduce such errors, the semiconductor manufactures may periodically identify the type of dopant in a semiconductor substrate by measuring the conductivity and mobility of the particular substrate. This process includes mechanically contacting the substrate with electrical contacts and passing an electrical current through the substrate. Although this procedure correctly identifies the type of dopant, mechanically contacting the substrate with the electrical contacts is not desirable. First, the electrical contacts can introduce or generate small particles that can contaminate the substrate and affect subsequent processes. Second, this process is time-consuming and reduces the throughput of manufacturing semiconductor devices. Therefore, there is a need to quickly determine the type of dopant in a semiconductor substrate without contaminating the workpieces.

SUMMARY

The present invention is directed toward methods and apparatus for assessing a constituent in a semiconductor substrate. Several embodiments of the invention are directed toward non-contact methods and systems for identifying an atom specie of a dopant implanted into the semiconductor substrate using techniques that do not mechanically contact the substrate with electrical leads or other types of mechanical measuring instruments. For example, one embodiment of a non-contact method of assessing a constituent in a semiconductor substrate in accordance with the invention comprises obtaining an actual reflectance spectrum of infrared radiation reflected from the semiconductor substrate, and ascertaining a plasma frequency value ($\omega_p$) and a collision frequency value ($\gamma$) for the semiconductor substrate based on the actual reflectance spectrum. This method can further include identifying a dopant type based on a relationship between dopant types and (a) plasma frequency values and (b) collision frequency values.

Another embodiment of a method of assessing a constituent in a semiconductor substrate in accordance with the invention comprises detecting an actual IR reflectance spectrum of a specific semiconductor substrate by irradiating at least a portion of the substrate with IR radiation and measuring the intensity of IR radiation reflected from the substrate. This embodiment can further include ascertaining a plasma frequency value and a collision frequency value for the actual IR reflectance spectrum, and determining a dopant type in the semiconductor substrate using the ascertained plasma and collision frequency values.

Another embodiment of a method in accordance with the invention is a method of assessing a dopant type in a semiconductor substrate by obtaining a plasma frequency value and a collision frequency value associated with the specific dopant without mechanically contacting the substrate. This method further includes determining or identifying the type of atom of the dopant based on the obtained plasma frequency and collision frequency values.

Another embodiment of the invention is directed toward an apparatus for assessing a constituent of a semiconductor substrate. The apparatus can include an infrared source configured to direct a beam of radiation in a desired infrared bandwidth to the substrate, and a detector configured to determine an actual infrared reflectance spectrum of a semiconductor substrate. This embodiment of the apparatus can further include a computer operable medium operatively coupled to the detector to receive the actual infrared reflectance spectrum. The computer operable medium contains instructions that (1) ascertain a plasma frequency value ($\omega_p$) and a collision frequency value ($\gamma$) for the semiconductor substrate based on the actual infrared reflectance spectrum, and (2) determine a dopant type based on a relationship between dopant types and (a) plasma frequency values and (b) collision frequency values.

Another embodiment of an apparatus for assessing a constituent of a semiconductor substrate comprises an infrared source configured to direct a beam of radiation in a desired infrared bandwidth to the substrate, and a detector configured to determine the actual infrared reflectance spectrum of a semiconductor substrate. This embodiment of the apparatus can further include a computer operable medium operatively coupled to the detector. The computer operable medium contains instructions that (1) ascertain a model plasma frequency value and a model collision frequency value for the actual infrared reflectance spectrum, and (2) determine a dopant type in the semiconductor substrate using the model plasma and collision frequency values and a relationship between dopant types and a combination of plasma frequency values and collision frequency values.

DETAILED DESCRIPTION

Various embodiments of the invention are described in this section to provide specific details for a thorough understanding and enabling description of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively, and terms are defined as set forth in the American Heritage College Dictionary, Third Edition, published by Houghton Mifflin Company unless expressly specified otherwise. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of items in the list.

Figure 1:
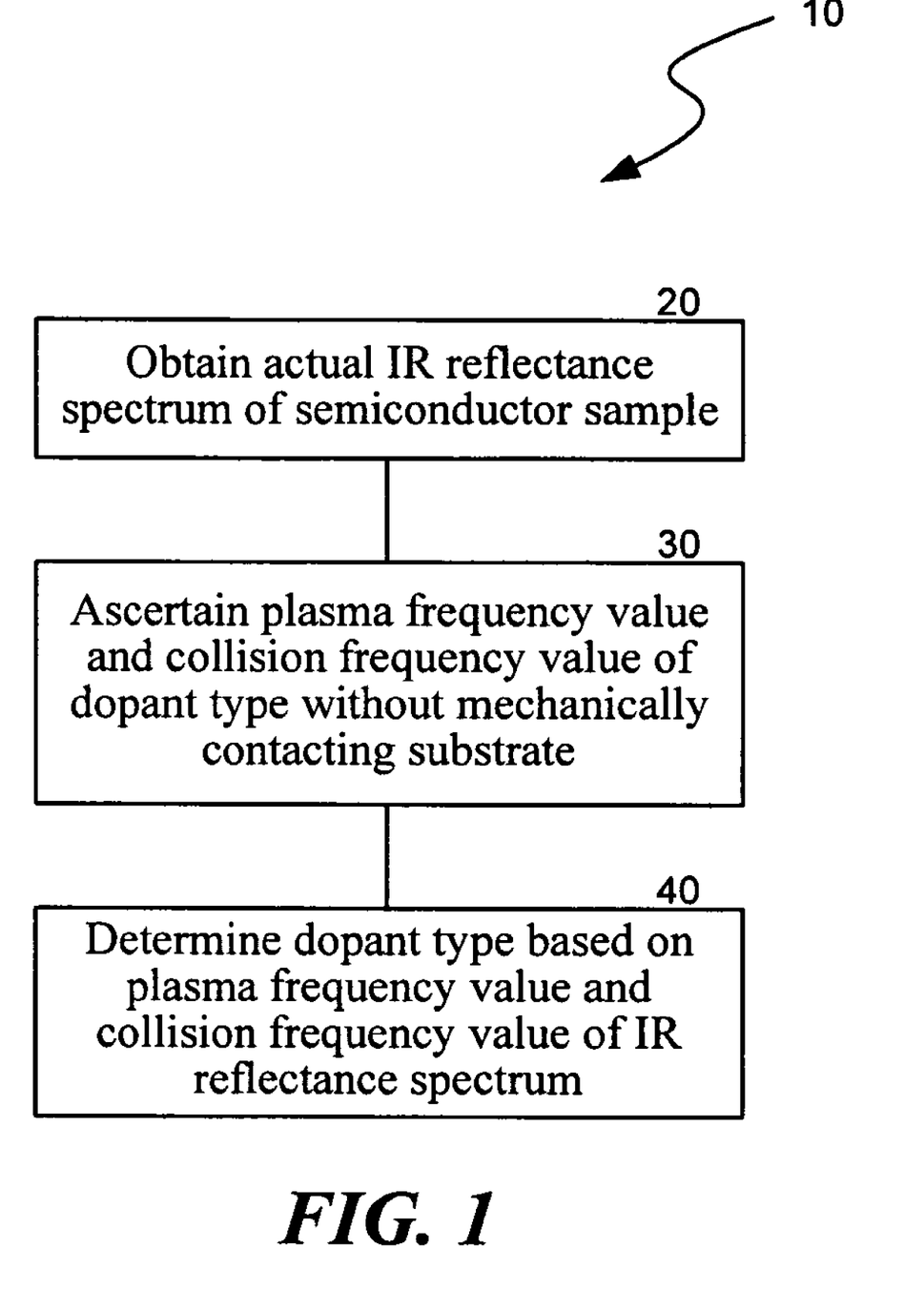
FIG. 1 is a flow chart illustrating a non-contact method for assessing a constituent in a semiconductor substrate in accordance with an embodiment of the invention.

A. Embodiments of Non-Contact Methods of Assessing a Constituent in a Semiconductor Substrate FIG. 1 is a flow chart illustrating one embodiment of a non-contact assessment method 10 for assessing a constituent in a semiconductor substrate in accordance with the invention. The assessment method 10 is particularly well suited for identifying the type of dopant incorporated (e.g. implanted) into a silicon wafer, gallium arsenide wafer, or other type of semiconductor substrate. An aspect of the assessment method 10 is that the incorporated atom specie can be identified without mechanically contacting the substrate with an electrode or other mechanical member. One embodiment of the assessment method 10 includes a data acquisition procedure 20, a modeling procedure 30, and an identification procedure 40. The data acquisition procedure 20 comprises obtaining an actual infrared (IR) reflectance spectrum of the semiconductor substrate. The modeling procedure 30 comprises ascertaining a plasma frequency value and a collision frequency value of the dopant type without mechanically contacting the semiconductor substrate, and the identification procedure 40 comprises determining the dopant type based upon the ascertained plasma frequency and collision frequency values of the IR reflectance spectrum. Each of these procedures is described in more detail below. One aspect of several embodiments of the assessment method 10 is that the doping atom specie can be identified quickly and without mechanically contacting the substrate to enhance the throughput and reduce potential contamination of the semiconductor substrate.

The data acquisition procedure 20 is a non-contact procedure that collects data regarding the dopant atom specie without mechanically contacting the semiconductor substrate with an instrument for measuring a parameter of the dopant atoms. In one embodiment, the data acquisition procedure 20 uses Fourier Transform Infrared Spectroscopy (FTIR) to obtain an IR reflectance spectrum of the substrate. The data acquisition procedure 20, for example, typically includes irradiating the substrate with infrared radiation in a selected bandwidth and detecting the intensity of infrared radiation reflected from the semiconductor substrate across the bandwidth. The radiation can have a wave number of approximately 400-4,000 cm$^{-1}$ for several applications.

The modeling procedure 30 ascertains the plasma frequency value and the collision frequency value of the doped semiconductor substrate using the IR reflectance spectrum from the data acquisition procedure 20. The plasma frequency is a function of the concentration of the dopant atoms and the mass of the carrier, and the collision frequency is a dampening factor that is a function of the concentration of the dopant atoms and the type of the dopant atoms. As explained below, the plasma frequency and the collision frequency values ascertained from the IR reflectance spectrum are used to identify the dopant atom specie in the substrate.

Figure 2A:
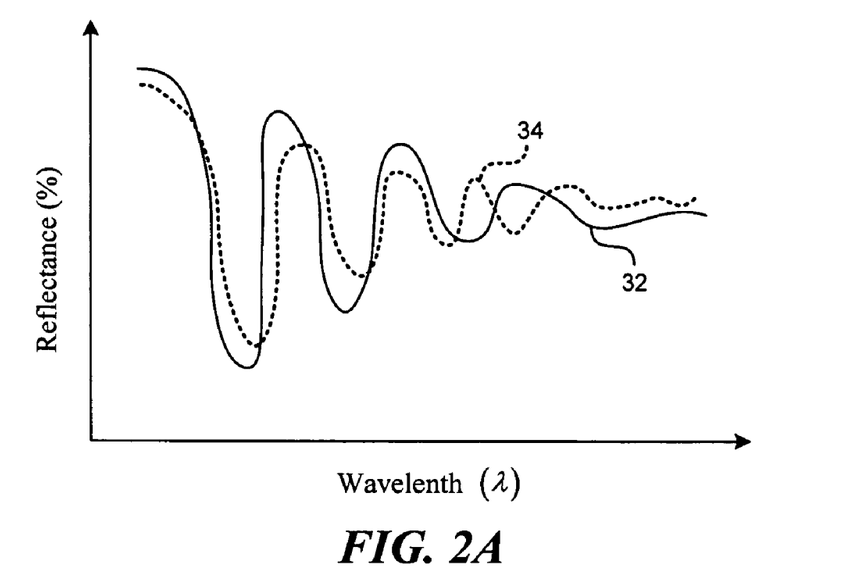
FIG. 2A is a graph illustrating a stage of ascertaining a plasma frequency value and a collision frequency value in accordance with an embodiment of the method of FIG. 1.
Figure 2B:
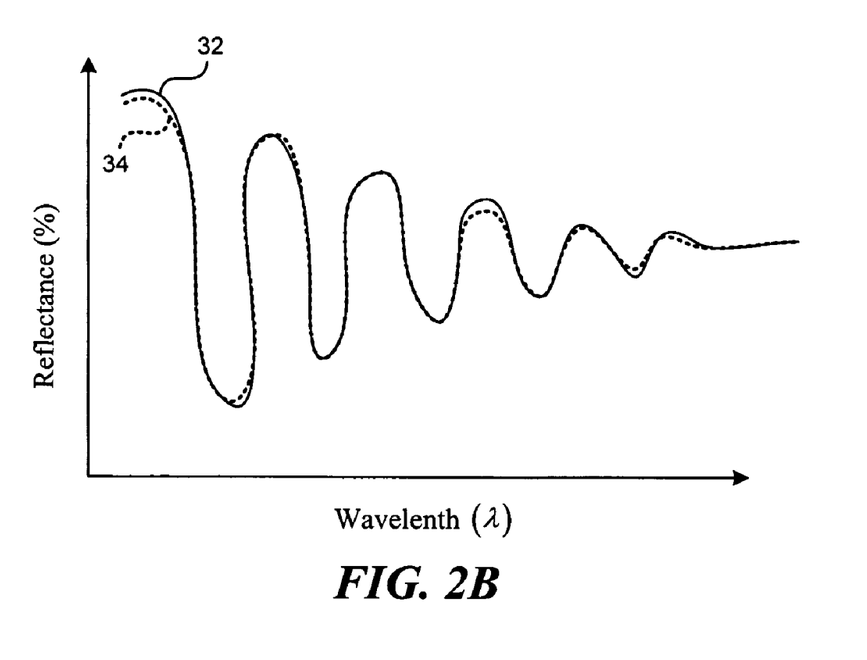
FIG. 2B is a graph illustrating a subsequent stage of ascertaining a plasma frequency value and a collision frequency value in accordance with an embodiment of the method of FIG. 1.

FIGS. 2A and 2B graphically illustrate the operation of one embodiment of the modeling procedure 30. Referring to FIG. 2A, an actual IR reflectance spectrum 32 from the data acquisition procedure 20 can be represented as a function of the reflectance intensity and the wavelength. A theoretical or model reflectance spectrum 34 is then fitted to the actual reflectance spectrum 32 by iteratively adjusting a model plasma frequency value and a model collision frequency value. FIG. 2B illustrates an example of when the model reflectance spectrum 34 is adequately fitted to the actual reflectance spectrum 32.

In one embodiment, the model reflectance intensity spectrum 34 is determined by using a general formula for stack layer reflectance. For example, as described in *Principles of Optics* (Max Born and Emil Wolf, Cambridge University Press, 1959), the dielectric function is approximated by the Drude model as set forth by the equation:

$$\varepsilon = \varepsilon_{\mathrm{HF}}\left(1 - \frac{\omega_p^2}{E(E + i\gamma)}\right) \quad \text{(Equation 1)}$$

This embodiment of the modeling procedure includes initially choosing a model plasma frequency value $\omega_p$ and a model collision frequency value $\gamma$. The initial model plasma frequency and model collision frequency values can be selected by choosing values in a known range based on the expected dopant atom specie and dopant concentration in the semiconductor substrate. Other variations of the Drude model can be based on variables that are related to the plasma and collision frequency values, such as the conductivity ($\sigma$), resistivity (ρ), mobility (μ) and/or scattering time (τ). For example, another useful form of the Drude model is:

$$\varepsilon = \varepsilon_{HF}\left[1 - \frac{\sigma \cdot \frac{1}{\tau}}{\omega^2 + i \cdot \omega \cdot \frac{1}{\tau}}\right] \quad \text{(Equation 2)}$$

The modeling procedure 30 of this embodiment continues by computing a model reflectance spectrum using the Drude model set forth above in Equation 1, or another suitable variation of a Drude model based on variables that are related to the plasma and collision frequencies. The modeling procedure 30 further includes mathematically comparing the actual reflectance spectrum 32 to the model reflectance spectrum 34 as graphically shown in FIGS. 2A-B. It will be appreciated that actual plots of the actual IR reflectance spectrum and the model reflectance spectrum are not necessarily generated and outputted as shown in FIGS. 2A-B, but rather the data can be stored and compared in other formats. The modeling procedure 30 further includes adjusting the model plasma frequency value and/or the model collision frequency value based on the difference between the computed model reflectance spectrum 34 and the actual reflectance spectrum 32. The model plasma frequency and collision frequency values can be adjusted by known optimization techniques, such as non-linear regression, to minimize the difference between the actual reflectance spectrum 32 and the model reflectance spectrum 34. The modeling procedure 30 can continue by computing a new model reflectance spectrum, comparing the new model reflectance spectrum with the actual reflectance spectrum, and readjusting the model plasma frequency and collision frequency values until the model reflectance spectrum 34 is adequately fitted with the actual reflectance spectrum 32 as shown in FIG. 2B. The model plasma frequency value and the model collision frequency value for the fitted model reflectance spectrum 34 respectively define the plasma frequency value $\omega_p$ and the collision frequency value $\gamma$ of the specific dopant atom specie implanted in the semiconductor substrate. The assessment method 10 uses the plasma frequency value $\omega_p$ and the model frequency value $\gamma$ in the identification procedure 40 (FIG. 1) to identify the dopant atom specie in the semiconductor substrate.

Figure 3:
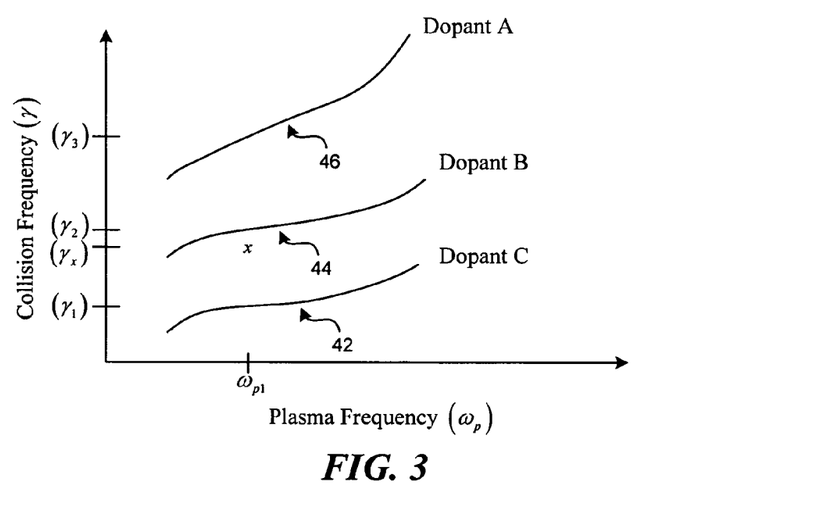
FIG. 3 is a graph of relationships between types of dopants and combinations of plasma frequency values and collision frequency values in accordance with one embodiment of the method of FIG. 1.

FIG. 3 is a graph illustrating one embodiment of the identification procedure 40 that uses the plasma frequency value $\omega_p$ and collision frequency value $\gamma$ from the modeling procedure 30. Referring to FIG. 3, the dopant atom specie can be identified based on a relationship between plasma frequency values and collision frequency values. For example, a Dopant A can have a unique first relationship 42 between the plasma frequency and the collision frequency values. Similarly, a Dopant B can have a second relationship 44 and a Dopant C can have a third relationship 46 based on the plasma frequency and collision frequency values. As a result, the particular dopant type can be identified based upon the plasma frequency value $\omega_p$ and collision frequency value $\gamma$ ascertained from the modeling procedure 30 by determining which dopant type best corresponds to the particular $\omega_p$ and $\gamma$ set. For example, if the plasma frequency value is approximately $\omega_{p1}$ and the collision frequency value is approximately $\gamma_2$, then this set of plasma frequency and collision frequency values corresponds to the line 44 and indicates that the dopant atom specie is Dopant B. In a typical application, the actual coordinates may not fall directly on a predetermined relationship between the plasma frequency and collision frequency values for a particular dopant such that the identification procedure 40 may include estimating the dopant type based upon the proximity to a predetermined relationship. For example, if the plasma frequency value is $\omega_{p1}$ and the collision frequency value is $\gamma_x$, then the dopant atom specie would still be identified as Dopant B because this coordinate is closer to line 44 than line 42.

Figure 4:
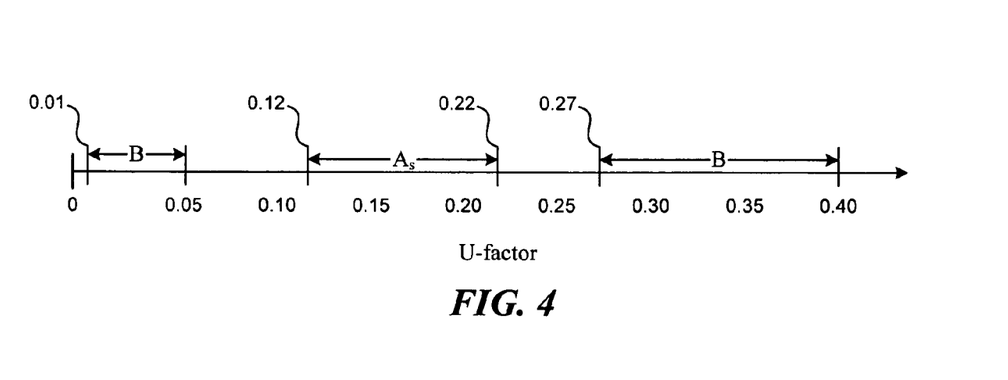
FIG. 4 is a graph of another relationship between types of dopants and a metric factor based on plasma frequency and collision frequency values in accordance with a different embodiment of the method shown in FIG. 1.

FIG. 4 illustrates another embodiment of the identification procedure 40 for use in the assessment method 10. In this embodiment, a U-factor is computed using the ascertained plasma frequency value $\omega_p$ and collision frequency value $\gamma$ to define a metric that reduces the affect of dopant concentration on determining the atom specie. The U-factor can be calculated using several different equations. For example, the U-factor can be calculated as follows:

$$\text{U-factor} = \omega_p^2 \cdot \gamma \quad \text{(Equation 3)}$$

Referring to FIG. 4, individual dopant atom species have discrete ranges of U-factors. For example, in silicon substrates the U-factor ranges for several common dopant atoms are as follows: (1) Boron—0.01-0.05; (2) Arsenic—0.12-0.22; and (3) Phosphorus—0.27-0.40. The U-factor will be different for other types of substrates and other species of atoms. This embodiment of the identification procedure accordingly includes calculating the U-factor for the semiconductor substrate based upon the plasma frequency value $\omega_p$ and the collision frequency value $\gamma$ ascertained in the modeling procedure 30, and then identifying the dopant atom specie based on the U-factor according to the ranges set forth in FIG. 4. This embodiment of the atom identification procedure 40 is expected to be particularly useful because it simplifies the process.

Figure 5:
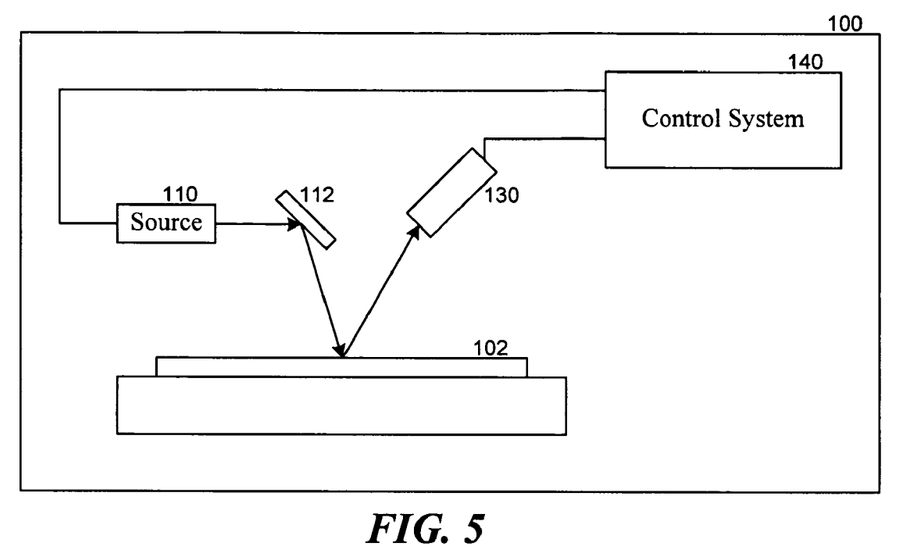
FIG. 5 is a schematic view of an apparatus for assessing a constituent in a semiconductor substrate in accordance with an embodiment of the invention.

B. Embodiments of Apparatus for Non-Contact Assessment of Constituents in Semiconductor Substrates FIG. 5 is a schematic illustration of an apparatus 100 for assessing a dopant atom specie or other constituent in a semiconductor substrate 102. The apparatus 100 can be a free standing system separate from a workpiece processing tool, or the apparatus 100 can be a component of a processing tool that performs a process on the workpiece (e.g., etching, patterning, planarizing, plating, etc.). In this embodiment, the apparatus 100 includes an infrared source 110 configured to direct a beam of radiation at wavelengths in a desired infrared bandwidth to the substrate 102, and a detector 130 configured to sense the intensity of infrared radiation reflecting from the substrate 102. The infrared source 110 can further include a beam controller 112 that directs the infrared beam to one or more desired regions on the workpiece 102. The infrared source 110 and detector 130 can be a suitable FTIR system that obtains an actual IR reflectance spectrum for the substrate 102.

The apparatus 100 further includes a control system 140 operatively coupled to the detector 130. In this embodiment, the control system 140 is also operatively coupled to the infrared source 110. The control system 140 of this embodiment performs the data acquisition procedure 20 to obtain the IR reflectance spectrum, the modeling procedure 30 to ascertain the plasma frequency and collision frequency values, and the identification procedure 40 to identify the dopant type. The control system 140, for example, can include a computer operable medium that (1) ascertains a plasma frequency value and a collision frequency value for the semiconductor substrate based upon the actual infrared reflectance spectrum detected by the detector 130, and (2) determines a dopant type based upon a relationship between dopant types and the combination of (a) plasma frequency values and (b) collision frequency values.

Figure 6:
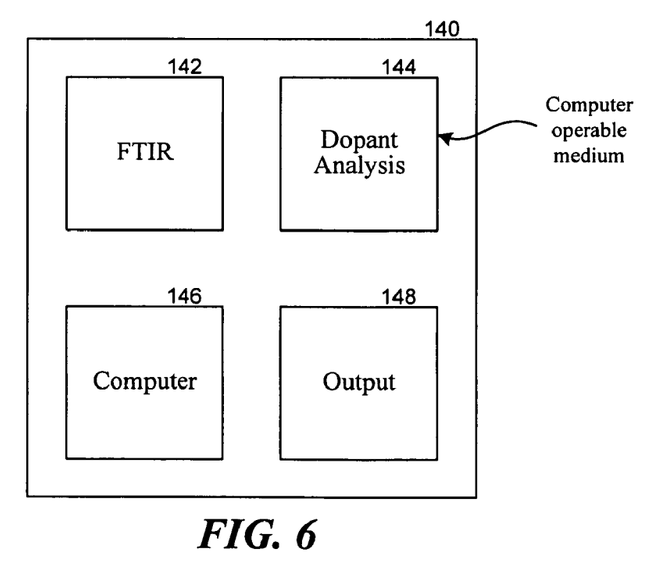
FIG. 6 is a schematic view of a control system including a computer operable medium containing instructions for use with the apparatus of FIG. 5 to assess a constituent of a semiconductor substrate in accordance with an embodiment of the invention.

FIG. 6 is a schematic view illustrating one embodiment of the control system 140 in accordance with the invention. In this embodiment, the control system 140 includes an FTIR module 142 that operates the infrared source 110 and the detector 130 to obtain the actual infrared reflectance spectrum. The control system 140 further includes a dopant analysis module 144 including the computer operable medium with the instructions to ascertain the plasma frequency and collision frequency values from the actual infrared reflectance spectrum and identify the dopant atom specie based upon the ascertained plasma frequency and collision frequency values. The control system 140 further includes a computer 146 and an output 148 operably coupled to the FTIR module 142 and the dopant analysis module 144. In operation, the computer 146 interacts with the FTIR module and the dopant analysis module 144 to perform the data acquisition procedure 20, the modeling procedure 30, and the identification procedure 40. The computer 146 also outputs the identified dopant atom specie to the output 148 and/or stores it in memory.

Figure 7:
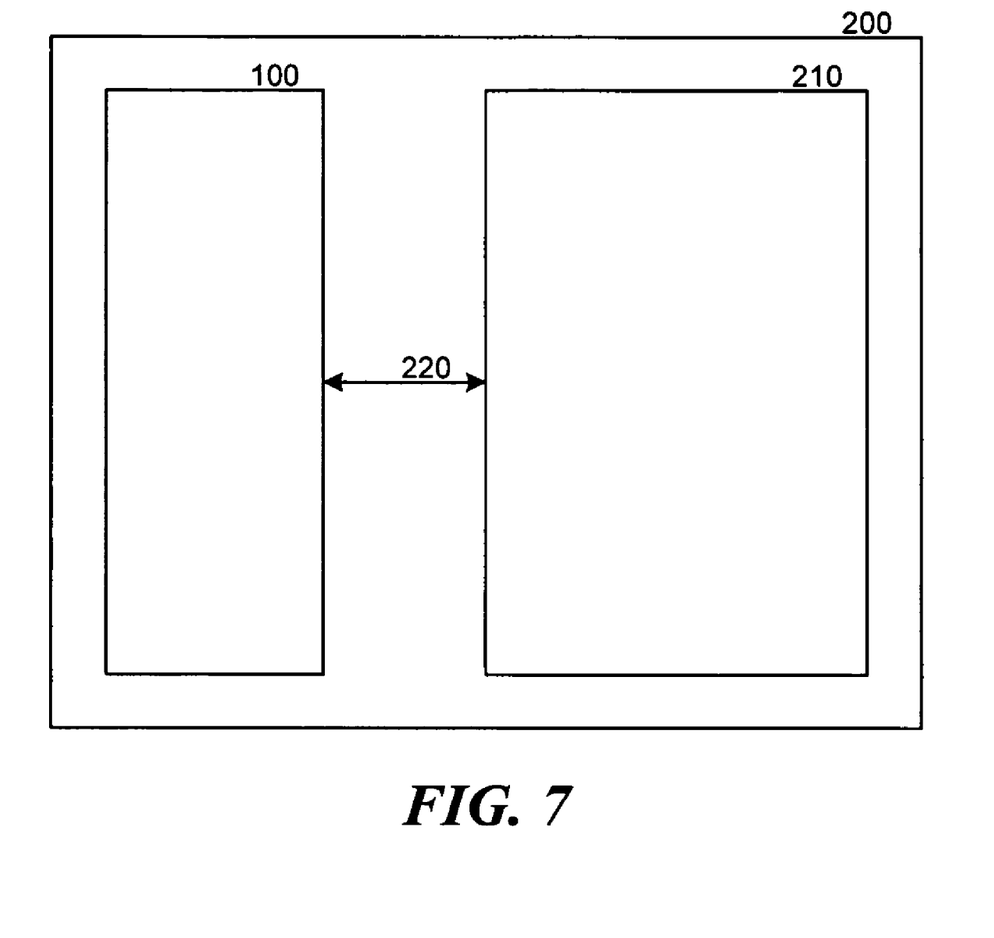
FIG. 7 is a tool including an apparatus for non-contact assessment of a constituent in a semiconductor substrate and a workpiece processing assembly for performing a process on substrate in accordance with another embodiment of the invention.

FIG. 7 is a schematic view illustrating a tool 200 incorporating the apparatus 100 shown in FIG. 6. For example, the tool 200 can include the non-contact assessment apparatus 100, a workpiece processing assembly 210, and an automatic workpiece handling system 220. The workpiece processing assembly 210 can be a photolithography tool, etching tool, planarizing tool, plating tool, vapor deposition tool, metallurgy tool, or other type of tool for manufacturing semiconductor devices. The workpiece handling device 220 can be an automatic rotary robot or linear track robot that holds a substrate in an end-effector to transfer substrates between the non-contact assessment apparatus 100 and the workpiece processing assembly 210.

Specific embodiments of the invention have been described above for purposes of illustration, but various modifications may be made to these embodiments without deviating from the invention. Aspects of the invention described in the context of particular embodiments, for example, may be combined or eliminated in other embodiments. Moreover, although the above description details certain embodiments of the invention and describes the best mode contemplated, the invention can be practiced in many other ways. The modeling procedure, for example, can use a Lorentz-Drude model instead of the Drude model. In general, the terms used in the following claims should not be construed to limit the invention to the specific embodiments disclosed in the specification unless such terms have been expressly defined in the above Detailed Description. Therefore, the invention is not limited, except as by the pending claims and all equivalent ways of practicing or implementing the invention under the claims.

I claim:

1. A non-contact method of assessing a constituent in a semiconducter substrate, comprising:
    obtaining an actual reflectance spectrum of infrared radiation reflected from the semiconductor substrate;
    ascertaining a plasma frequency value ($\omega_p$) and a collision frequency value ($\gamma$) for the semiconductor substrate based on the actual reflectance spectrum; and
    identifying a dopant type based on a relationship between dopant types and (a) plasma frequency values and (b) collision frequency values.

2. The method of claim 1 wherein obtaining the actual reflectance spectrum comprises irradiating the substrate with infrared radiation in a selected bandwidth and detecting the intensity of infrared radiation reflected from the substrate.

3. The method of claim 1, further comprising providing a relationship between dopant types and (a) plasma frequency values and (b) collision frequency values.

4. The method of claim 1 wherein ascertaining $\omega_p$ and $\gamma$ comprises fitting a model reflectance spectrum to the actual reflectance spectrum by iteratively adjusting a model plasma frequency value and/or a model collision frequency value until the model reflectance spectrum is adequately fitted to the actual reflectance spectrum at which point $\omega_p$ equals the model plasma frequency value and $\gamma$ equals the model collision frequency value for the adequately fitted model reflectance spectrum.

5. The method of claim 1 wherein ascertaining $\omega_p$ and $\gamma$ comprises:
    (1) choosing a model plasma frequency value and a model collision frequency value;
    (2) computing a model reflectance spectrum using the model plasma frequency and collision frequency values;
    (3) comparing the actual reflectance spectrum to the model reflectance spectrum;
    (4) adjusting the model plasma frequency value and/or the model collision frequency value based on a fit between the actual reflectance spectrum and the model reflectance spectrum; and
    (5) repeating the computing, comparing and adjusting procedures until the model reflectance spectrum is adequately fitted with the actual reflectance spectrum, wherein $\omega_p$ equals the model plasma frequency value and $\gamma$ equals the model collision frequency value for the adequately fitted model spectrum.

6. The method of claim 5 wherein computing the model reflectance spectrum comprises calculating the model reflectance across a bandwidth of the infrared range using the following equation:

$$\varepsilon = \varepsilon_{HF}\left(1 - \frac{\omega_p^2}{E(E + i\gamma)}\right)$$

7. The method of claim 5 wherein computing the model reflectance spectrum comprises calculating the model reflectance across a bandwidth of the infrared range using at least one of a Drude model and/or a Lorentz-Drude model.

8. The method of claim 1 wherein identifying the dopant type comprises comparing the ascertained $\omega_p$ and the ascertained $\gamma$ with a predetermined relationship associating dopant types with plasma frequency and collision frequency values.

9. The method of claim 1 wherein identifying the dopant type comprises:
    (1) calculating a U-factor based on the ascertained $\omega_p$ and the ascertained $\gamma$; and
    (2) comparing the calculated U-factor with a predetermined relationship associating dopant types with U-factors.

10. The method of claim 9 wherein calculating the U-factor comprises inputting the ascertained $\omega_p$ and the ascertained $\gamma$ into the following equation:

U-factor=$\omega_p^2 \cdot \gamma$.

11. A method of assessing a constituent of a semiconductor substrate, comprising:
    detecting an actual IR reflectance spectrum of a specific semiconductor substrate by irradiating at least a portion of the substrate with IR radiation and measuring intensity of IR radiation reflected from the substrate;

ascertaining a plasma frequency value and a collision frequency value for the actual IR reflectance spectrum; and determining a dopant type in the semiconductor substrate using the plasma and collision frequency values.

12. The method of claim 11 wherein ascertaining the plasma frequency value and the collision frequency value comprises fitting a model reflectance spectrum to the actual IR reflectance spectrum by iteratively adjusting a model plasma frequency value and/or a model collision frequency value until the model reflectance spectrum is adequately fitted to the actual reflectance spectrum.

13. The method of claim 11 were ascertaining the plasma frequency value and the collision frequency value for the actual IR reflectance spectrum comprises computing a model reflectance spectrum using estimated plasma frequency and collision frequency values using the following equation:

$$\varepsilon = \varepsilon_{HF}\left(1 - \frac{\omega_p^2}{E(E + i\gamma)}\right)$$

14. The method of claim 11 wherein determining a dopant type comprises comparing the ascertained plasma frequency and collision frequency values with a predetermined table associating dopant types with plasma frequency and collision frequency values.

15. The method of claim 11 wherein identifying the dopant type comprises (1) calculating a U-factor based on the ascertained plasma frequency and collision frequency values, and (2) comparing the calculated U-factor with a predetermined table associating dopant types with U-factors.

16. A method of assessing a dopant in a semiconductor substrate comprising:

obtaining a plasma frequency value and a collision frequency value associated with the specific dopant without mechanically contacting the substrate; and determining the type of atom of the dopant based on the obtained plasma frequency and collision frequency values.

17. The method of claim 16 wherein obtaining a plasma frequency value and a collision frequency value comprises a data acquisition procedure including detecting an actual IR reflectance spectrum of a specific semiconductor substrate by irradiating at least a portion of the substrate with IR radiation and measuring intensity of IR radiation reflected from the substrate.

18. The method of claim 17 wherein obtaining a plasma frequency value and the collision frequency value further comprises fitting a model reflectance spectrum to the actual IR reflectance spectrum by iteratively adjusting a model plasma frequency value and/or model collision frequency value until the model reflectance spectrum is adequately fitted to the actual IR reflectance spectrum.

19. The method of claim 18 wherein the model reflectance spectrum is derived by the following equation:

$$\varepsilon = \varepsilon_{HF}\left(1 - \frac{\omega_p^2}{E(E + i\gamma)}\right)$$

20. The method of claim 16 wherein identifying the dopant type comprises comparing the obtained plasma frequency and collision frequency values with a predetermined relationship associating dopant types with plasma frequency and collision frequency values.

21. The method of claim 16 wherein determining the dopant type comprises (1) calculating a U-factor based on the obtained plasma frequency and collision frequency values, and (2) comparing the calculated U-factor with a predetermined relationship associating dopant types with U-factors.

* * * * *